United States Patent
Naito

(10) Patent No.: US 7,545,236 B2
(45) Date of Patent: Jun. 9, 2009

(54) ELECTROMECHANICAL FILTER UTILIZING A QUANTUM DEVICE AND SENSING ELECTRODE

(75) Inventor: Yasuyuki Naito, Tokyo (JP)

(73) Assignee: Panasonic Corporation, Osaka (JP)

( * ) Notice: Subject to any disclaimer, the term of this patent is extended or adjusted under 35 U.S.C. 154(b) by 187 days.

(21) Appl. No.: 10/599,957

(22) PCT Filed: Apr. 11, 2005

(86) PCT No.: PCT/JP2005/007027

§ 371 (c)(1),
(2), (4) Date: Oct. 16, 2006

(87) PCT Pub. No.: WO2005/107070

PCT Pub. Date: Nov. 10, 2005

(65) Prior Publication Data

US 2007/0222541 A1    Sep. 27, 2007

(30) Foreign Application Priority Data

Apr. 28, 2004 (JP) .................... 2004-132655
Mar. 18, 2005 (JP) .................... 2005-080286

(51) Int. Cl.
H03H 9/46 (2006.01)
H03H 9/48 (2006.01)
H03H 9/52 (2006.01)
H03H 9/62 (2006.01)
H03H 9/22 (2006.01)
H03H 9/24 (2006.01)

(52) U.S. Cl. .................... 333/186; 333/200; 257/415; 257/288

(58) Field of Classification Search .......... 333/186, 333/200, 197
See application file for complete search history.

(56) References Cited

U.S. PATENT DOCUMENTS

| | | | |
|---|---|---|---|
| 5,550,516 A * | 8/1996 | Burns et al. | 331/65 |
| 5,589,082 A * | 12/1996 | Lin et al. | 216/2 |
| 5,694,059 A | 12/1997 | Wada et al. | |
| 6,210,988 B1 | 4/2001 | Howe et al. | |
| 6,621,134 B1 * | 9/2003 | Zurn | 257/415 |

FOREIGN PATENT DOCUMENTS

| | | |
|---|---|---|
| JP | 7-221322 | 8/1995 |
| JP | 10-512046 | 11/1998 |
| JP | 2002-534285 | 10/2002 |

OTHER PUBLICATIONS

Wang et al., "1.14 GHz Self-Aligned Vibrating Micromechanical Disk Resonator", IEEE Radio Frequency Integrated Circuits Symposium, 2003, pp. 335-338.

(Continued)

*Primary Examiner*—Barbara Summons
(74) *Attorney, Agent, or Firm*—Pearne & Gordon LLP

(57) ABSTRACT

An electromechanical filter capable of attaining a size reduction and a higher integration and executing a high-sensitivity signal sensing is provided. A quantum device is used as a sensing portion to implement a fine and highly sensitive sensing. A microvibrator 101 that is able to resonate with an input signal, and a sensing electrode 103 arranged at a predetermined interval to the microvibrator are provided. Since a change in an electrostatic capacity between the microvibrator and the sensing electrode can be sensed, a high-sensitivity sensing mechanism that is hard to realize in the prior art can be achieved.

14 Claims, 12 Drawing Sheets

OTHER PUBLICATIONS

Kang et al., "Amplitude Detecting Michromechanical Resonating Beam Magnetometer", IEEE, The Eleventh Annual International Workshop on MEMS 98, Jan.1998 (Cited on ISR).

Bannon, III, et al., "High-Q HF Microelectromechanical Filters", IEEE Journal of Solid-State Circuits, vol. 35, No. 4, Apr. 2000, pp. 512-526 (Cited on ISR).

* cited by examiner

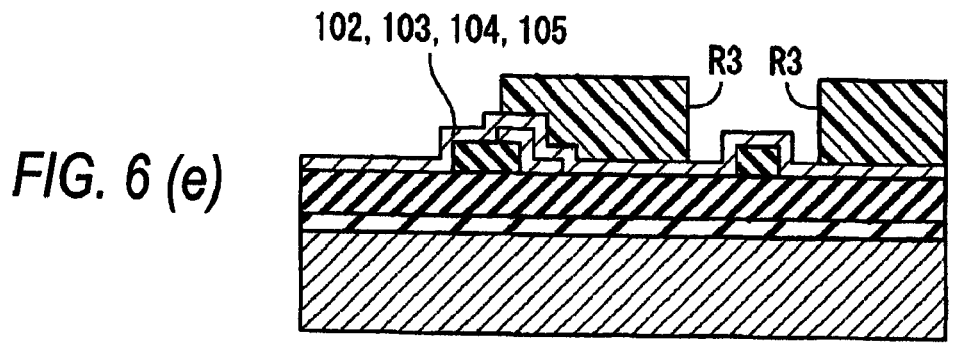
FIG. 6 (e)
FIG. 6 (f)
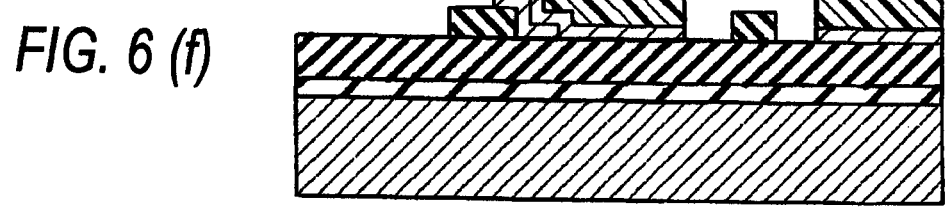
FIG. 6 (g)
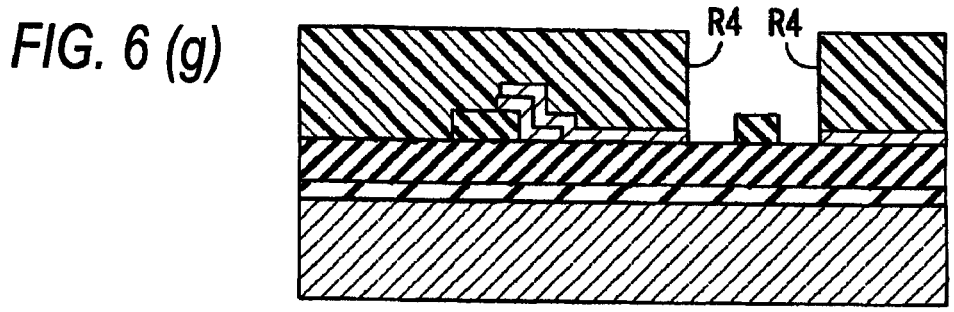
FIG. 6 (h)
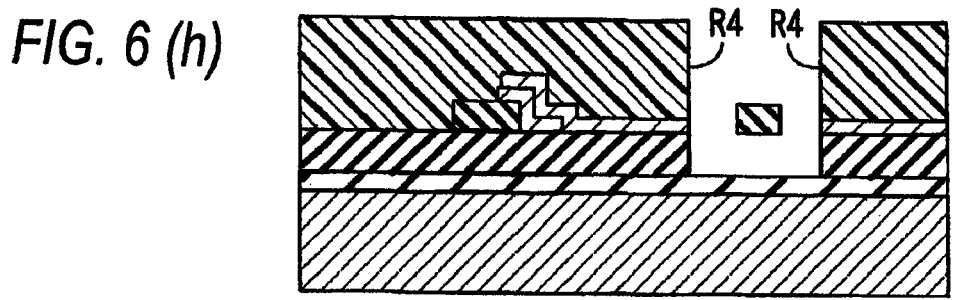
FIG. 6 (i)
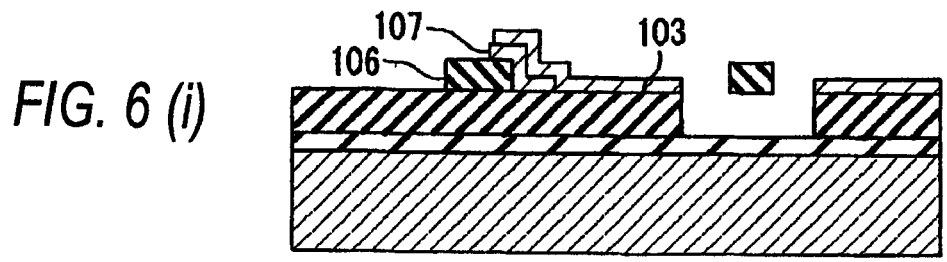

US 7,545,236 B2

ELECTROMECHANICAL FILTER UTILIZING A QUANTUM DEVICE AND SENSING ELECTRODE

TECHNICAL FIELD

The present invention relates to an electromechanical filter including a microvibrator as a resonator, a mechanism for exciting the microvibrator, and a quantum device for sensing a signal.

BACKGROUND ART

With the spread of the information communication equipment such as the radio terminal, or the like, a frequency used in the communication is spreading increasingly over the broad band from several hundreds MHz for the cellular phone, or the like to several GHz for the wireless LAN, or the like. In the existing circumstances, the terminals corresponding to various communication systems respectively are used independently. In the future, the implementation of the radio terminal that is able to conform to various communication systems solely is expected.

Also, in the wake of downsizing of the radio terminal, a miniaturization of passive parts such as the filter, and the like built in the case of the radio terminal is requested. Nowadays there exists the problem that a miniaturization of the filter is difficult, particularly a miniaturization of the filter utilizing an electric resonance caused by an LC resonance circuit, or the like used often in radio communication is difficult because its resonator size depends on an electrical length. Now the filter looks for the new signal selecting principle.

In such circumstances, the development of RF-MEMS filter fabricated by the MEMS (Micro Electro Mechanical Systems) technology is advanced swiftly. This RF-MEMS filter is an electromechanical filter using a mechanical vibration of a microvibrator. In this filter, an electrical oscillation of a high-frequency signal can be converted into the mechanical vibration of the microvibrator and then this mechanical vibration is converted again into the electrical oscillation to output an output signal. Therefore, as the advantage of this filter, it can be considered that its resonator size does not depend on an electrical length and thus a size reduction of the filter can be attained. Also, this filter can be built in an RF-IC because such filter can be manufactured by the process having a good affinity for the RF-IC. Thus, this RF-MEMS filter is expected as the technology that contributes largely to a size reduction of the radio portion.

As the electromechanical filter using the microvibrator in the GHz band, the filter using a silicon substrate has been proposed (Non-Patent Literature 1, for example). In this Non-Patent Literature 1, a circular-disk type microvibrator is constructed on the silicon substrate and then a band-pass filter whose center frequency is 1.14 GHz is obtained by utilizing a mechanical resonance of the microvibrator. A signal filtering mechanism is that an electrostatic force is generated between a driving electrode and the microvibrator by a high-frequency signal being input from a signal input port to the driving electrode, and the microvibrator is excited at a frequency of the high-frequency signal. When a signal having a mechanical self-resonance frequency of the microvibrator is input, the microvibrator is largely excited and a change of electrostatic capacity is caused by a change in distance between the microvibrator and a sensing electrode. Then, the mechanical vibration of the microvibrator is picked up by the sensing electrode as the electrical oscillation because a voltage $V_P$ is applied to the microvibrator, and a signal is output from the sensing electrode to the signal output port. Namely, only the signal of a frequency that is set by the self-resonance frequency of the microvibrator can be selectively output.

Currently, an increase of an adaptive frequency and an increase of a Q value (Quality Factor) are being tried in a small-sized GHz band electromechanical filter. In order to attain a higher adaptive frequency, the self-resonance frequency of the microvibrator must be increased higher. For that purpose, a method of reducing a size of the microvibrator, a method of using a higher mode of the microvibrator, and the like are considered. In the case where a size of the microvibrator is to be reduced, when a miniaturization proceeds from micrometer order to nanometer order, amplitude of the vibration is reduced in the Angstrom order and comes close to a noise level of the quantum vibration or the thermal vibration. Therefore, the implementation of an ultrahigh-sensitivity vibration sensing method that makes it possible to measure a vibrational displacement at the quantum limit is needed.

Patent Literature 1: JP-T-10-512046

Non-Patent Literature 1: J. Wang, et al., IEEE RFIC Symp., 8-10 June, pp. 335-338, 2003

DISCLOSURE OF THE INVENTION

Problems that the Invention is to Solve

However, when an increase of the self-resonance frequency of the microvibrator is tried, the amplitude of the vibration of the microvibrator is reduced at present. For this reason, such a problem exists that it is difficult to sense an infinitesimal change of the electrostatic capacity generated by the amplitude of the vibration as the electric signal output. In order to sense the infinitesimal vibration of the microvibrator with higher sensitivity, either a distance between the microvibrator and the sensing electrode must be reduced or a voltage $V_P$ applied to the microvibrator must be increased. For example, in the electromechanical filter set forth in Non-Patent Literature 1, when a circular-disk type microvibrator having a radius 20 µm and a thickness 2 µm is used, a distance between the microvibrator and the sensing electrode is 100 nm and the microvibrator is formed by the etching having a high aspect ratio in which a depth is set to 3 µm. When it is tried from now on to get a finer distance between the microvibrator and the sensing electrode, such a situation is forecasted that the microvibrator reaches the limit of the manufacturing method. Also, there is the problem that the voltage $V_P$ applied to the microvibrator is from 12.9 V to 30.54 V and this voltage is too high in the application of the radio terminal. Further, there is the problem that a noise figure is enhanced by using the high voltage $V_P$.

In order to attain a higher adaptive frequency of the electromechanical filter, a method of sensing the infinitesimal vibration of the microvibrator at the voltage $V_P$ applied to the microvibrator, which is adaptable to the radio terminal, within a distance between the producible microvibrator and the sensing electrode is needed. For that purpose, a method of sensing a change of a minute charge excited between the microvibrator and the sensing electrode and outputting it as an electric signal is needed. In Patent Literature 1, a method of sensing the vibration by using MOSFET is disclosed. The configuration in this Patent Literature has the problem in the structure of the vibration sensing surface that opposes to the microvibrator. In the flat structure, a very small quantity of excited charge is scattered on the vibration sensing surface and thus a potential enough to control the MOSFET is not output.

The present invention has been made in view of the above circumstances, and it is an object of the present invention to provide a fine and high-sensitivity electromechanical filter.

Means for Solving the Problems

Therefore, an electromechanical filter of the present invention aims at implementing a fine and highly sensitive sensing by using a quantum device as a sensing portion, and includes a microvibrator that resonates with an input signal; and a sensing electrode arranged at a predetermined interval to the microvibrator; wherein a quantum device that senses a change in an electrostatic capacity between the microvibrator and the sensing electrode to output the change as an electric signal of the microvibrator is provided.

According to this configuration, a fine amount of charges can be sensed and a high-sensitivity sensing can be implemented since the quantum device is used as the sensing portion. Here, the "quantum device" means a device constructed to sense a fine amount of charges, and indicates the quantum device containing a semiconductor device such as MOSFET, SET, or the like. In the method of injecting the charge into the conductive island of SET of the present invention, a voltage $V_P$ that needs a high voltage in the conventional electromechanical filter can be lowered since the SET can be controlled by the fine amount of charges. Also, the noise figure NF can be lowered because of the reduction of $V_P$.

Also, in the electromechanical filter of the present invention, the sensing electrode includes a charge exciting electrode formed on an insulating layer on a substrate, a projection structure formed on a face opposing to the microvibrator of the charge exciting electrode, and a potential sensing electrode formed on the charge exciting electrode via the insulating layer and connected to the projection structure.

According to this configuration, the charges can be collected into the projection structure, the enlarged potential generated in a minute area opposing to the microvibrator can be output, and the potential can be supplied to the gate of MOSFET via the potential sensing electrode. Also, a very small amount of charges can be supplied effectively to the conductive island 114 of the SET.

Also, in the electromechanical filter of the present invention, the microvibrator has a driving electrode arranged at a predetermined interval to the microvibrator, and the microvibrator is excited by an electrostatic force generated between the microvibrator and the driving electrode.

According to this configuration, the microvibrator can be easily displaced by using the method of using the inboard beam as the signal line, or the like.

Also, in the electromechanical filter of the present invention, an input signal is input into the driving electrode.

According to this configuration, the resonance frequency can be easily adjusted by adjusting the potential given to the driving electrode, and thus a tunable electromechanical filter can be constructed.

Also, in the electromechanical filter of the present invention, the microvibrator is arranged in a magnetic field and is excited by a Lorentz force generated by the magnetic field.

According to this configuration, the magnetic field passing through the microvibrator can be changed by the Lorentz force, and thus the direction of vibration can be easily changed. Therefore, flexibility in designing a layout of the sensing electrode can be enhanced.

Also, in the electromechanical filter of the present invention, an input signal is input into one end of the microvibrator.

According to this configuration, the driving electrode provided separately in the prior art can be neglected. Therefore, the structure can be simplified and downsized much more.

Also, in the electromechanical filter of the present invention, the quantum device is a MOSFET.

According to this configuration, a fine charge can be sensed easily.

Also, in the electromechanical filter of the present invention, the sensing electrode functions as a gate electrode of the quantum device.

According to this configuration, the miniaturization of the device can be accomplished, and also a moving distance of the charge can be reduced to speed up an operation.

Also, in the electromechanical filter of the present invention, the quantum device is an SET.

According to this configuration, a fine charge can be sensed easily.

Also, in the electromechanical filter of the present invention, the sensing electrode functions as a conductive island of the quantum device.

According to this configuration, the miniaturization of the device can be accomplished, and also a moving distance of the charge can be reduced to speed up an operation.

Also, in the electromechanical filter of the present invention, the microvibrator and the quantum device are formed on a same substrate.

According to this configuration, the downsizing can be attained much more.

Also, in the electromechanical filter of the present invention, the microvibrator and the sensing electrode of the quantum device are formed of a same material.

According to this configuration, the filter that is easily manufactured and has high reliability can be obtained.

Also, in the electromechanical filter of the present invention, the sensing electrode of the quantum device is formed of a semiconductor material.

According to this configuration, the quantum device can be formed by the same steps as the semiconductor, the conductive island, or the like. Therefore, simplification of the process and improvement of the reliability can be achieved by using the semiconductor material such as the doped silicon, or the like.

Also, the electromechanical filter of the present invention further includes a signal amplifying unit provided to a signal output port side.

Also, the electromechanical filter of the present invention further includes a voltage adjusting unit for adjusting a voltage applied to the microvibrator to get a desired signal amplification factor.

Also, the electromechanical filter of the present invention further includes a voltage adjusting unit for adjusting a gate voltage of the quantum device to get a desired signal amplification factor.

Also, the electromechanical filter of the present invention further includes a circuit for restoring a signal by upconverting the signal that is downconverted to the signal output port side, and an adjusting unit for adjusting a source-drain voltage of the quantum device to optimize a mixed signal, wherein the quantum device is usable as a mixer.

Also, in the electromechanical filter of the present invention, a plurality of microvibrators are coupled mechanically.

According to this configuration, the bandwidth (band width) of the resonance frequency of the microvibrator and the Q factor of the vibration can be controlled, so that the passing band, the cutting-off band, and the Q factor of the electromechanical filter can be controlled.

In this manner, the electromechanical filter of the present invention has the microvibrator and the quantum device that senses the vibration of the microvibrator and outputs it as the electric signal. Therefore, a high-sensitivity sensing mechanism that is hard to realize in the prior art can be achieved.

According to this configuration, the high-sensitivity electromechanical filter having the signal filtering function can be realized.

Advantages of the Invention

As explained as above, according to the present invention, an infinitesimal vibration of the microvibrator can be sensed by using the quantum device. Therefore, the band-pass filter for selecting only a signal of a predetermined frequency to output the signal and the band-stop filter for selecting only a signal of a predetermined frequency to block the signal can be implemented.

BRIEF DESCRIPTION OF THE DRAWINGS

[FIG. 6] Sectional views explaining steps of manufacturing the electromechanical filter in Embodiment 1 of the present invention step by step.

Figure 1:
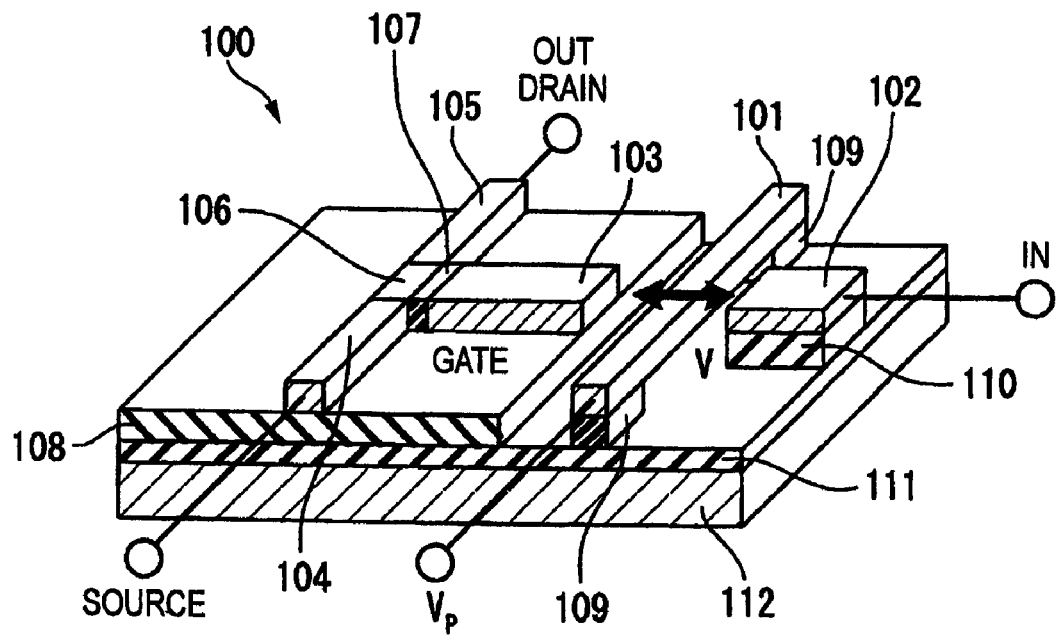
[FIG. 1] A view showing an electromechanical filter in Embodiment 1 of the present invention, wherein (a) is a perspective view showing a configuration of this electromechanical filter, and (b) is a circuit diagram showing the configuration of this electromechanical filter.
Figure 1:
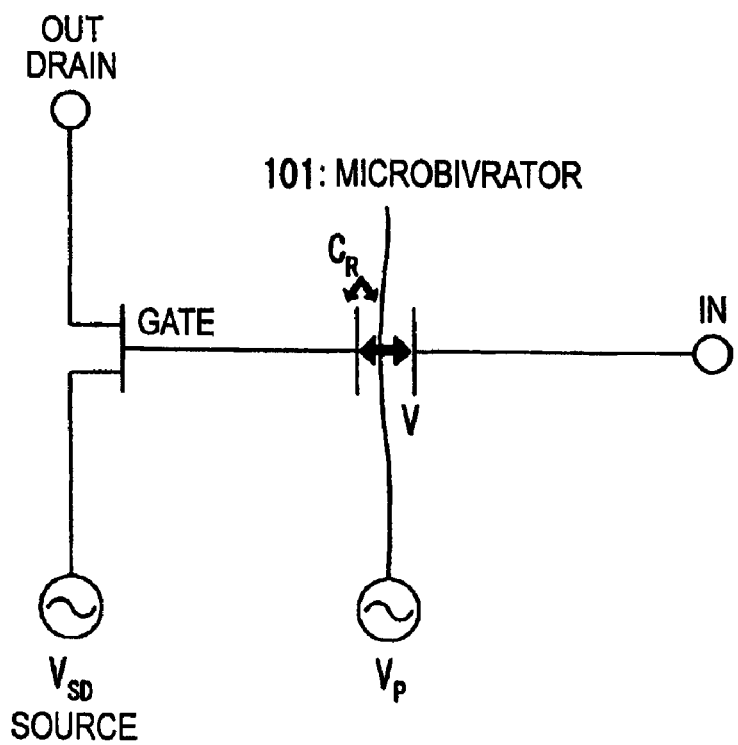

DESIGNATION OF REFERENCE NUMERALS AND SIGNS 100, 200, 300, 400, 500, 600 electromechanical filter
101 microvibrator
102 driving electrode
103, 103b sensing electrode
1031 charge exciting electrode
1032 potential sensing electrode
1033 projection structure
104 source electrode
105 drain electrode
106 semiconductor
107 (gate) insulating film
108, 111, 1034 insulating layer
109 post
110 spacer
112 substrate
113 photoresist
114 conductive island
115 gate electrode
116 charge Best Mode for Carrying Out the Invention Respective embodiments of the present invention will be explained in detail with reference to the drawings hereinafter.

Embodiment 1

An electromechanical filter in Embodiment 1 of the present invention is shown in FIG. 1.

FIG. 1(a) is a perspective view showing schematically a configuration of the electromechanical filter in Embodiment 1 of the present invention, and FIG. 1(b) is an equivalent circuit diagram of the same.

In this electromechanical filter 100, posts 109, a microvibrator 101 bridged between the posts 109, a spacer 110, and a driving electrode 102 provided on the spacer 110 are arranged on a substrate 112 on a surface of which an insulating layer 111 is formed. A signal input port IN for inputting a signal is connected to the driving electrode 102. When a high-frequency signal is input, a potential difference is generated between the driving electrode 102 and the microvibrator 101 and then an electrostatic force is applied to the microvibrator 101 at the same frequency as the high-frequency signal. A potential of the microvibrator 101 is controlled by the voltage $V_P$ applied to the microvibrator 101.

A sensing electrode 103 for sensing a displacement of the movable electrode 101 as a change of the electrostatic capacity is provided in the vicinity of the movable electrode 101. The sensing electrode 103 constitutes a gate electrode of a MOSFET (Metal Oxide Semiconductor Field Effect Transistor) that consists of a source electrode 104, a drain electrode 105, a semiconductor 106, and a gate insulating film 107, all of which are provided on an insulating layer 108. Then, a signal output port OUT for outputting a signal to the outside is connected to the drain electrode 105. The sensing electrode 103 acting as the gate electrode is formed on one side surface of the semiconductor 106 (formed of an amorphous silicon layer) via the gate insulating film 107.

Next, a method of sensing the vibration of the microvibrator and a signal filtering mechanism in this electromechanical filter 100 will be explained hereunder.

FIG. 1(b) is a circuit diagram showing the configuration of the electromechanical filter in Embodiment 1 of the present invention. The signal being input from the signal input port IN propagates to the driving electrode 102 and excites the microvibrator 101 at a frequency of the high-frequency signal. The microvibrator 101 is excited at a large amplitude only when the signal of the self-resonance frequency of the microvibrator 101 is input, and a distance between the microvibrator 101 and the sensing electrode 103 is changed to result in a change of an electrostatic capacity $C_R$. The vibration direction of the microvibrator 101 is indicated by V. At that time, an amount of change in the charge generated between the microvibrator 101 and the sensing electrode 103 is given by $\Delta Q = V_P \Delta C_R$, where $\Delta C_R$ is an amount of change in the electrostatic capacity $C_R$.

The smaller the amplitude of the vibration of the fine microvibrator 101 becomes, the smaller an amount of change in the charge $\Delta Q$ becomes. Thus, the vibration sensing method in the conventional electromechanical filter to sense directly an amount of change in the charge $\Delta Q$ is hard to pick up the signal. Therefore, in the electromechanical filter 100 of the present invention, a new system for inputting a very small amount of change in the charge $\Delta Q$ sensed by the sensing electrode 103 into a gate potential of the MOSFET and sensing the change in the charge $\Delta Q$ as a change in a drain current to output the signal is introduced.

Figure 3:
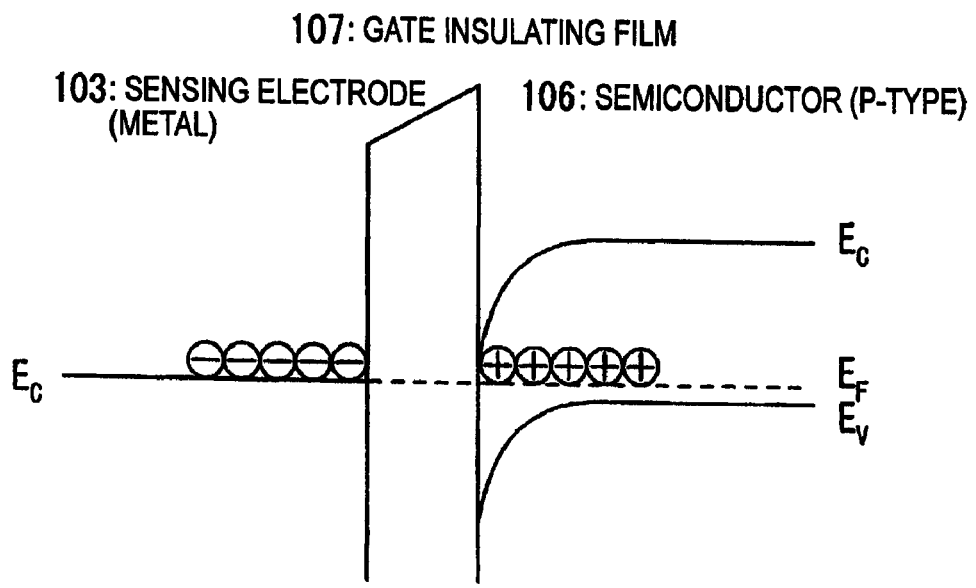
[FIG. 3] A band diagram of the electromechanical filter in the variation of Embodiment 1 of the present invention, wherein (a) is a band diagram of MOS junction (when a semiconductor (P-type) is employed), and (b) is a band diagram of MOS junction (when a semiconductor (N-type) is employed).
Figure 3:
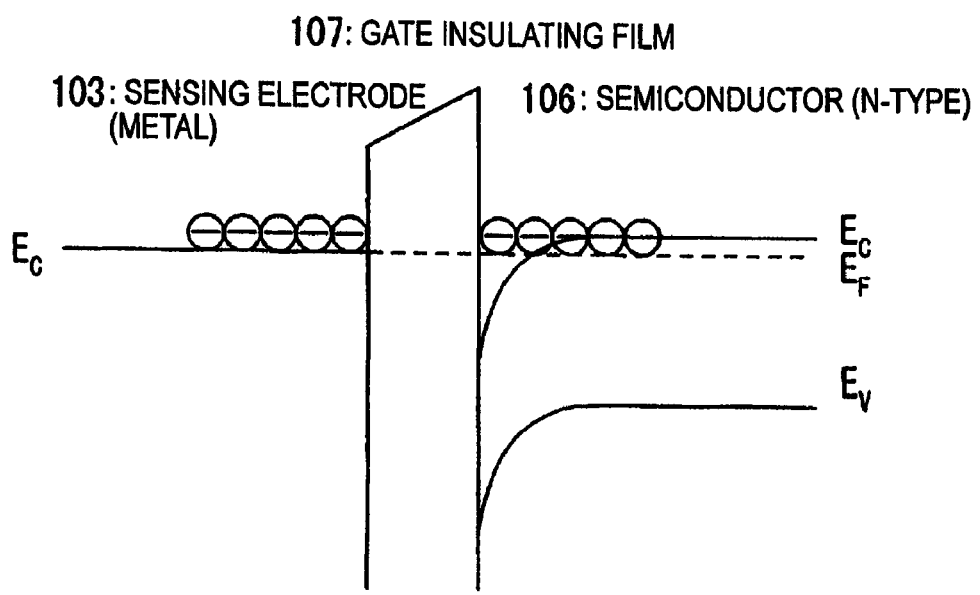

The sensing electrode 103 acts as the gate electrode of the MOSFET. A very small amount of change in the charge $\Delta Q$ sensed by the sensing electrode 103 excites the charge on the boundary between the gate insulating film 107 and the sensing electrode 103. A band diagram of MOS junction is shown in FIG. 3. When a P-type semiconductor is employed as a semiconductor 106 constituting a channel that is provided between the source electrode 104 and the drain electrode 105 (FIG. 3(a)), a depletion layer is formed on the boundary between the gate insulating film 107 and the semiconductor 106. In this case, carriers (holes) having the opposite polarity are induced on the semiconductor 106 side by the charges that are excited on the boundary between the sensing electrode 103 and the gate insulating film 107, and thus the depletion layer is reduced. Also, when an N-type semiconductor is employed as the semiconductor 106 (FIG. 3(b)), a potential of the sensing electrode 103 falls down relatively from the semiconductor 106 by the charges that are excited on the boundary between the sensing electrode 103 and the gate insulating film 107, and thus a band structure of the semiconductor 106 is deformed to be pulled toward the lower energy side on the boundary to the gate insulating film 107. According to this phenomenon, a conduction band $E_C$ overlaps partially with a Fermi level $E_F$ of the semiconductor 106 and the depletion layer on the boundary between the gate insulating film 107 and the semiconductor 106 is reduced. When a reduction of the depletion layer of the semiconductor 106 is brought about in this manner, a source-drain current flows by a source-drain voltage $V_{SD}$ applied between the source electrode 104 and the drain electrode 105 and then the signal is output to the drain electrode 105. A switching of this signal is generated at the frequency at which an amount of change in the charge $\Delta Q$ sensed by the sensing electrode 103 as the gate electrode is changed, and the frequency is equal to the self-resonance frequency of the microvibrator 101. In other words, only when the signal of the self-resonance frequency of the microvibrator 101 is input from the signal input port IN, the signal of the same frequency is output to the signal output port OUT.

Figure 4:
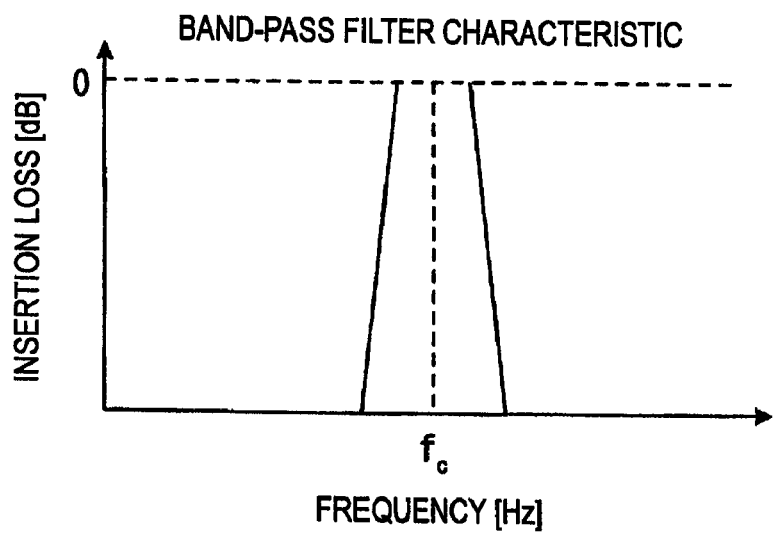
[FIG. 4] A view showing the filtering characteristic of the electromechanical filter in Embodiments 1 to 4 of the present invention, wherein (a) is a view showing the band-pass filtering characteristic, and (b) is a view showing the band-stop filtering characteristic.
Figure 4:
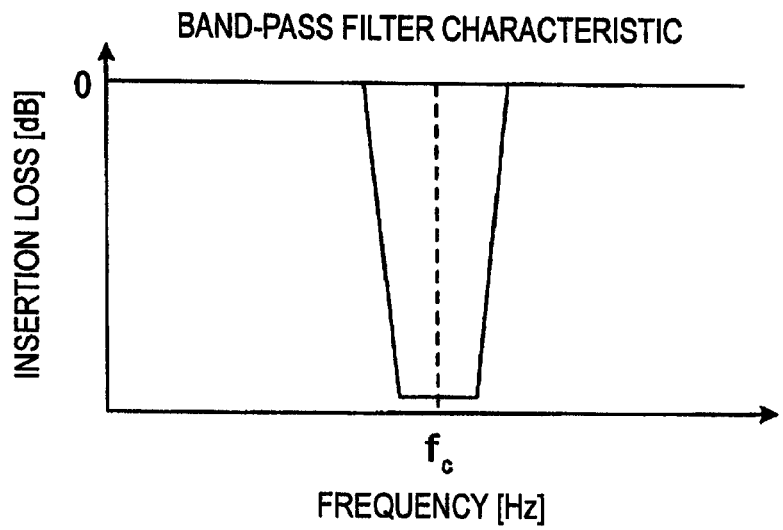

FIG. 4(a) is a view showing the signal filtering characteristic of the electromechanical filter in Embodiment 1 of the present invention. The electromechanical filter can have the band-pass filter characteristic with a center frequency fc.

In this manner, according to the electromechanical filter 100, a size reduction can be easily achieved and also the only the signal of a predetermined frequency can be selectively output.

Next, a variation of Embodiment 1 of the present invention will be explained hereunder. FIG. 2(a) is a perspective view showing schematically a variation of the electromechanical filter shown in FIG. 1. A difference of this variation from Embodiment 1 is that a circular disk is used in an electromechanical filter 200 shown in FIG. 2(a) as the microvibrator 101 in contrast to the inboard beam used in the electromechanical filter 100. FIG. 2(b) is a circuit diagram showing the variation of the electromechanical filter in FIG. 1. The signal filtering can be performed by the similar configuration to the electromechanical filter 100.

In the electromechanical filter 200 in FIG. 2(a), the same names and the same symbols are affixed to the portions similar to those in the electromechanical filter 100 shown in FIG. 1(a), and their explanation will be omitted herein.

In this manner, a cantilever, a square plate, or the like can be used as the microvibrator 101 in addition to the above.

As shown in FIG. 4(b), the electromechanical filter in Embodiment 1 of present invention can be formed to have the band-stop filtering characteristic having a center frequency fc. The filter showing the band-stop filtering characteristic having a center frequency fc can be provided by connecting in series the electromechanical filters each having the band-pass filtering characteristic with the center frequency fc shown in FIG. 4(a).

Also, a power amplifier for amplifying a power of the output signal, or the like may be provided on the signal output port OUT side.

Also, the voltage $V_P$ applied to the microvibrator 101 can be adjusted to get a maximum signal amplification factor.

Also, a signal passing band can be controlled by coupling mechanically plural pieces of microvibrators.

Also, a multi-stage filter configuration in which the electromechanical filters of the present invention are connected in parallel or in series can be constructed.

Next, a method of manufacturing the electromechanical filter 100 will be explained hereunder.

Figure 2:
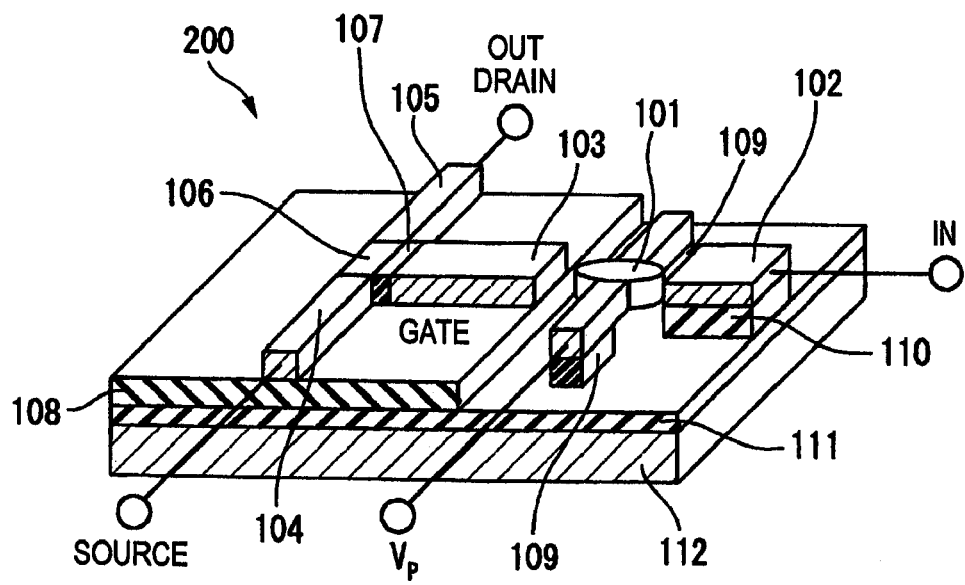
[FIG. 2] A view showing an electromechanical filter in a variation of Embodiment 1 of the present invention, wherein (a) is a perspective view showing a configuration of this electromechanical filter, and (b) is a circuit diagram showing the configuration of this electromechanical filter.
Figure 2:
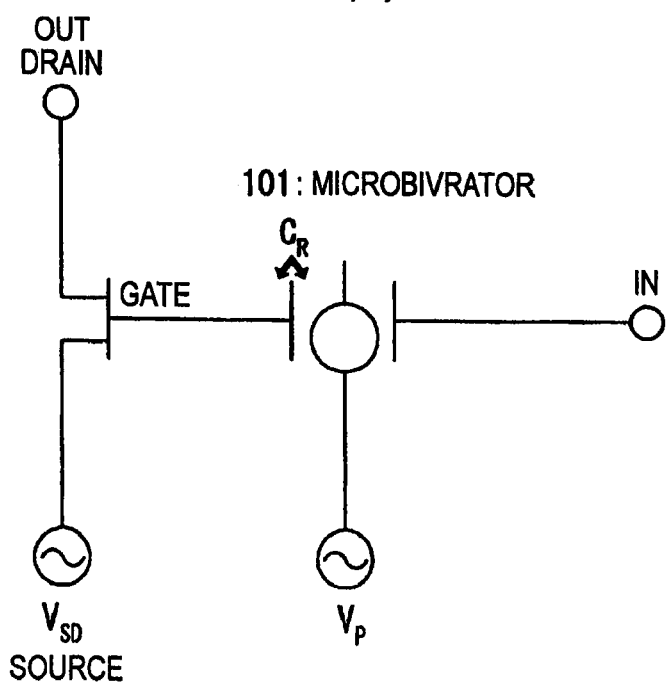

In this case, FIG. 1 and FIG. 2 are perspective views showing schematically the electromechanical filter respectively, wherein the gate insulating film 107 and the sensing electrode 103 are formed only on the sidewall side of the semiconductor 106. In following processes, the gate insulating film 107 and the sensing electrode 103 are formed to slightly overlap with the semiconductor 106, so that disconnection or short-circuit can be prevented by allowing a margin.

FIG. 5(a) to 5(d) and FIG. 6(e) to 6(i) are sectional explanatory views explaining steps of manufacturing the electromechanical filter 100 in Embodiment 1 of the present invention step by step.

Figure 5:
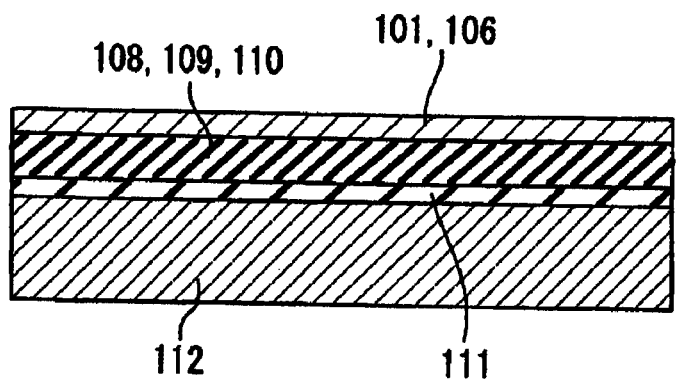
[FIG. 5] Sectional views explaining steps of manufacturing the electromechanical filter in Embodiment 1 of the present invention step by step.
Figure 5:
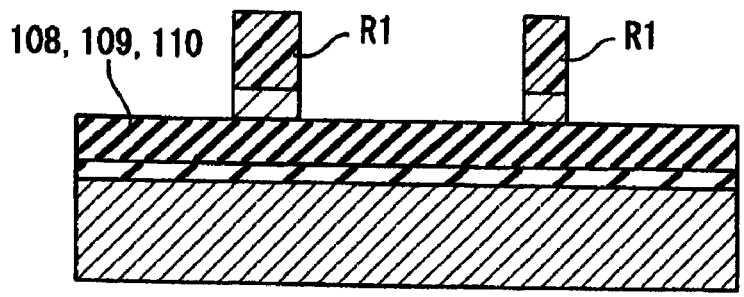
Figure 5:
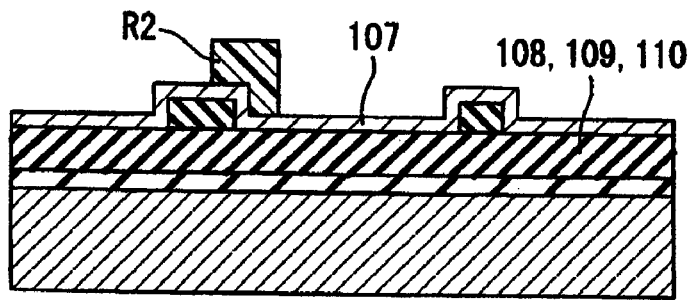
Figure 5:
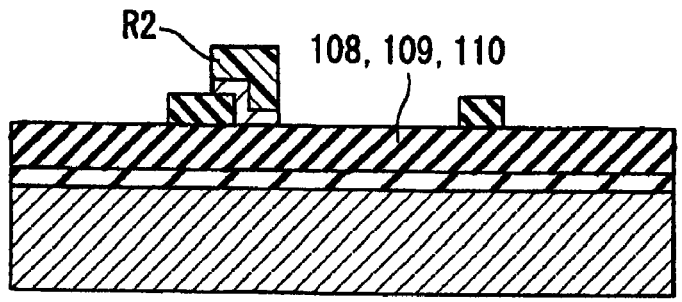

First, as shown in FIG. 5(a), the surface insulating layer 111 is formed on the substrate 112 by depositing a silicon oxide film of 20 nm film thickness by the thermal oxidation. Then, a silicon oxide film of 200 nm film thickness serving as the insulating layer 108, the posts 109, and the spacer 110 is formed by the CVD (Chemical Vapor Deposition) method. Then, a doped amorphous silicon film of 80 nm film thickness serving as the microvibrator 101 and the semiconductor 106 is deposited thereon by the CVD method. Here, the doping is applied to adjust a conductivity of the semiconductor and a carrier density. For example, boron as a P-type impurity or phosphorus as an N-type impurity is doped by the ion implantation method, or the like after the silicon film is formed, and thus the doped amorphous silicon film can be formed. Also, this doping possesses an effect of lowing an impedance of the vibrator. In this case, the doped amorphous silicon film can be formed while doping the impurity during the film formation. Also, first the amorphous silicon film may be formed, and then the polysilicon may be formed by annealing the amorphous silicon to get the polycrystal. Here, the substrate 112 is not limited to the silicon substrate, and a compound semiconductor substrate formed of gallium arsenide (GaAs), or the like may be employed. Also, the insulating layer 111 made of the silicon oxide film that is formed by the thermal oxidation may be formed by the CVD method or the sputtering, and also other insulating film such as a silicon nitride film, or the like may be employed.

Then, the microvibrator 101 and the semiconductor 106 are formed.

As shown in FIG. 5(b), a photoresist pattern R1 is formed on the doped silicon layer used as the microvibrator 101 and the semiconductor 106 later. Then, this photoresist pattern R1 is patterned by the electron beam lithography, the photolithography, or the like. Then, the amorphous silicon layer exposed from the photoresist pattern is patterned by the dry etching. Thus, the microvibrator 101 and the semiconductor 106 acting as the channel of the MOSFET are formed.

Then, the insulating film 107 is formed.

As shown in FIG. 5(c), the photoresist R1 is removed by the ashing, and then a silicon oxide serving as the gate insulating film 107 of the MOSFET is sputtered or deposited by the CVD method. Then, the photoresist is coated again on the insulating film 107, and then a photoresist pattern R2 is formed by patterning the photoresist by means of the electron beam lithography, the photolithography, or the like. As shown in FIG. 5(d), the insulating film 107 is patterned by the dry etching. In addition to the silicon oxide film, a silicon nitride film, an NO film or an ONO film as a laminated film consisting of a silicon oxide film and a silicon nitride film, a ferroelectric film made of barium titanate ($BaTiO_3$), strontium titanate ($SrTiO_3$), or the like may be employed as the insulating film 107.

Also, a memory function can be provided by using the ferroelectric film as the gate insulating film.

Then, the photoresist R2 is removed by the ashing, and then the driving electrode 102, the sensing electrode 103, the source electrode 104, and the drain electrode 105 are formed. In this case, if the insulating film 107 is left only on the sidewall of the semiconductor 106 by applying the anisotropic etching after the photoresist R2 is removed, a gate width can be set over the whole film thickness of the semiconductor 106.

As shown in FIG. 6(e), a metal material such as aluminum, or the like is deposited by the sputtering method, then a photoresist R3 is coated thereon, and then the photoresist R3 is patterned by the electron beam lithography, or the like.

Then, as shown in FIG. 6(f), the driving electrode 102, the sensing electrode 103, the source electrode 104, and the drain electrode 105 are formed by dry-etching the metal material. Then, the photoresist R3 is removed by the ashing.

Here, the driving electrode 102, the sensing electrode 103, the source electrode 104, and the drain electrode 105 can be formed by the lift-off method. Also, the metal material is not limited to the aluminum, and other material such as gold, copper, or the like may be employed.

Then, the microvibrator 101 is formed.

In order not to damage the portions except the etched portion by the etching that is applied to form a hollow structure of the microvibrator 101, a protection layer is provided. For example, as shown in FIG. 6(g), the photoresist is coated and then patterned by the electron beam lithography, the photolithography, or the like, and thus a photoresist pattern R4 is formed.

Then, as shown in FIG. 6(h), the insulating material is removed under the conditions that has selectivity to the silicon constituting the microvibrator 101, so that the microvibrator 101 is released in the air. As an etchant, HF, or the like is used.

Finally, the photoresist R4 is removed by the ashing. Thus, as shown in FIG. 6(i), the movable electrode 101 portion having the hollow structure is formed.

In this event, when it is secured that the high-frequency signal is not affected by the loss caused by the substrate 112, the formation of the insulating layer 111 can be omitted.

Also, in addition to the amorphous silicon, the semiconductor such as single crystal silicon, polysilicon, gallium arsenide, or the like, the metal such as aluminum, gold, copper, or the like, the superconductor, or the like may be employed as the material of the microvibrator 101. Also, the microvibrator 101 is formed by the same steps as the semiconductor 106 constituting the channel of the MOSFET, but the steps may be varied. For example, the microvibrator 101 can be formed by the same steps as the source-drain electrode, or the like. In this case, a desired impurity density may be obtained by doping the impurity separately in the subsequent step.

In above Embodiment 1, the sensing electrode 103 as the gate electrode is formed to cover the side surface and the upper surface of the semiconductor 106. In this case, as shown in the schematic view of FIG. 1, the sensing electrode 103 as the gate electrode may be arranged only on one side surface of the semiconductor 106 via the gate insulating film 107.

In manufacturing, an oxidizing process is applied to the circumference of the semiconductor 106 that is formed integrally in a state that the semiconductor 106 contacts the source-drain electrode, and then the sensing electrode 103 can be easily formed to cover both side surfaces and the upper surface via the gate insulating film 107.

Also, in above Embodiment 1, the gate insulating film 107 is formed by the anisotropic etching to leave the sidewall, as shown in FIG. 6(d), after the patterning of the gate insulating film 107. In this case, the semiconductor 106 (preferably the semiconductor should be formed integrally with the area acting as the source electrode 104 and the drain electrode 105) and the microvibrator 101 are patterned in the step in FIG. 5(b), and then the insulating film is formed by the deposition of the surface oxidation as the gate insulating film 107. Then, the sensing electrode 103 is formed as the gate electrode and patterned, then the gate insulating film 107 is patterned while using the sensing electrode 103 as a mask, and then the source electrode 104 and the drain electrode 105 are formed by the ion diffusion or the ion implantation. As a result, the lithography step applied to pattern the gate insulating film can be omitted.

With this arrangement, the number of the alignment steps can be reduced by one step and also the process can be simplified.

Embodiment 2

Figure 7:
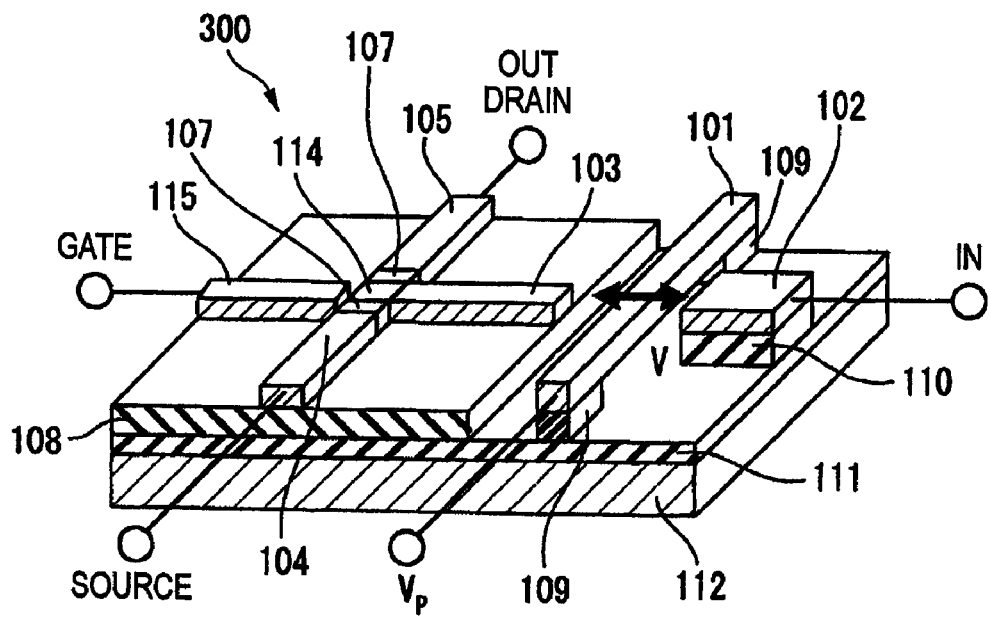
[FIG. 7] A view showing an electromechanical filter in Embodiment 2 of the present invention, wherein (a) is a perspective view showing a configuration of this electromechanical filter, and (b) is a circuit diagram showing the configuration of this electromechanical filter.
Figure 7:
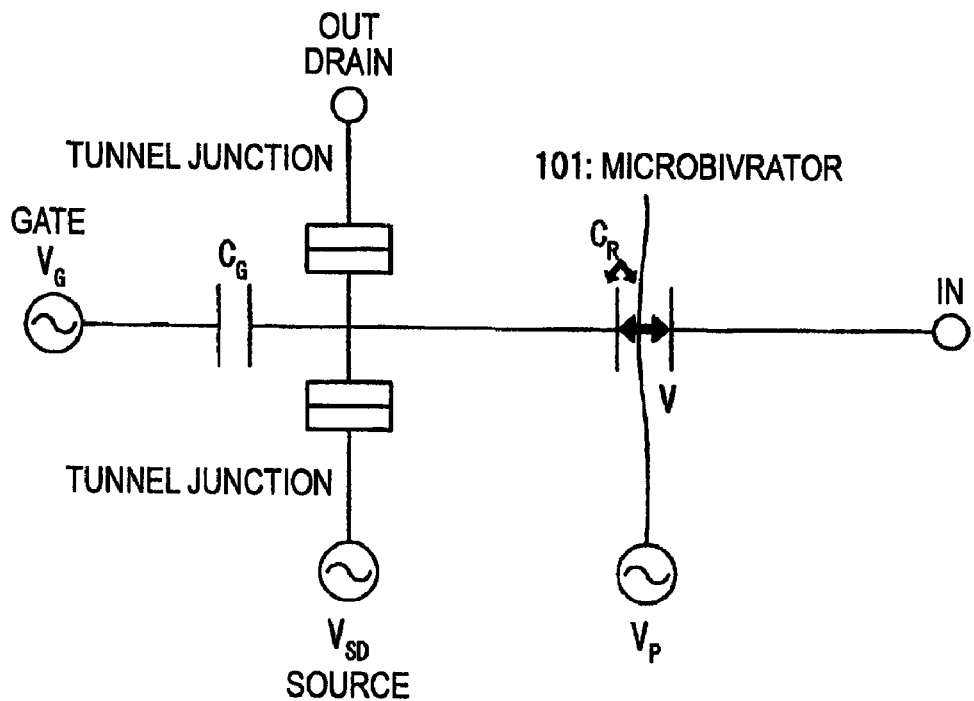

FIG. 7(a) is a perspective view showing a configuration of an electromechanical filter in Embodiment 2 of the present invention.

In an electromechanical filter 300 shown in FIG. 7(a), the microvibrator 101 is formed similarly to that in Embodiment 1 and has a feature that SET (Single Electron Transistor) is used as the sensing element in place of the MOSFET. Remaining portions are formed similar to Embodiment 1. More particularly, the microvibrator 101 bridged between the posts 109 and the driving electrode 102 provided on the spacer 110 are provided on the substrate 112 on the surface of which the insulating layer 111 is formed. The signal input port IN is connected to the driving electrode 102. When the high-frequency signal is input, a potential difference is generated between the driving electrode 102 and the microvibrator 101 and an electrostatic force is applied to the vibrator at the same frequency as the high-frequency signal. A potential of the microvibrator 101 is controlled by the voltage VP that is applied to the microvibrator 101.

The sensing electrode 103 is provided in the vicinity of the microvibrator 101 as the movable electrode. The sensing electrode 103 is connected to a conductive island 114 of the SET (Single Electron Transistor) that consists of the source electrode 104, the drain electrode 105, the insulating film 107, the conductive island 114, and a gate electrode 115. The signal output port OUT for outputting the signal to the outside is connected to the drain electrode 105.

Next, the method of sensing the vibration of the microvibrator and the signal filtering mechanism in the electromechanical filter 300 will be explained hereunder.

FIG. 7(b) is a circuit diagram showing the configuration of the electromechanical filter in Embodiment 2 of the present invention. The signal being input from the signal input port IN propagates to the driving electrode 102 and excites the microvibrator 101 at a frequency of the high-frequency signal. The microvibrator 101 is excited at a large amplitude only when the signal of the self-resonance frequency of the microvibrator 101 is input, and a distance between the microvibrator 101 and the sensing electrode 103 is changed to result in a change of an electrostatic capacity $C_R$. The vibration direction of the microvibrator 101 is indicated by V. At that time, an amount of change in the charge generated between the microvibrator 101 and the sensing electrode 103 is given by $\Delta Q = V_P \Delta C_R$, where $\Delta C_R$ is an amount of change in the electrostatic capacity $C_R$.

The smaller the amplitude of the vibration of the fine microvibrator 101 becomes, the smaller an amount of change in the charge $\Delta Q$ becomes. Thus, the vibration sensing method in the conventional electromechanical filter to sense directly an amount of change in the charge $\Delta Q$ is hard to pick up the signal. Therefore, in the electromechanical filter 300 of the present invention, a new system for sensing a very small amount of change in the charge $\Delta Q$ sensed by the sensing electrode 103 by the SET to output the signal is introduced.

Figure 9:
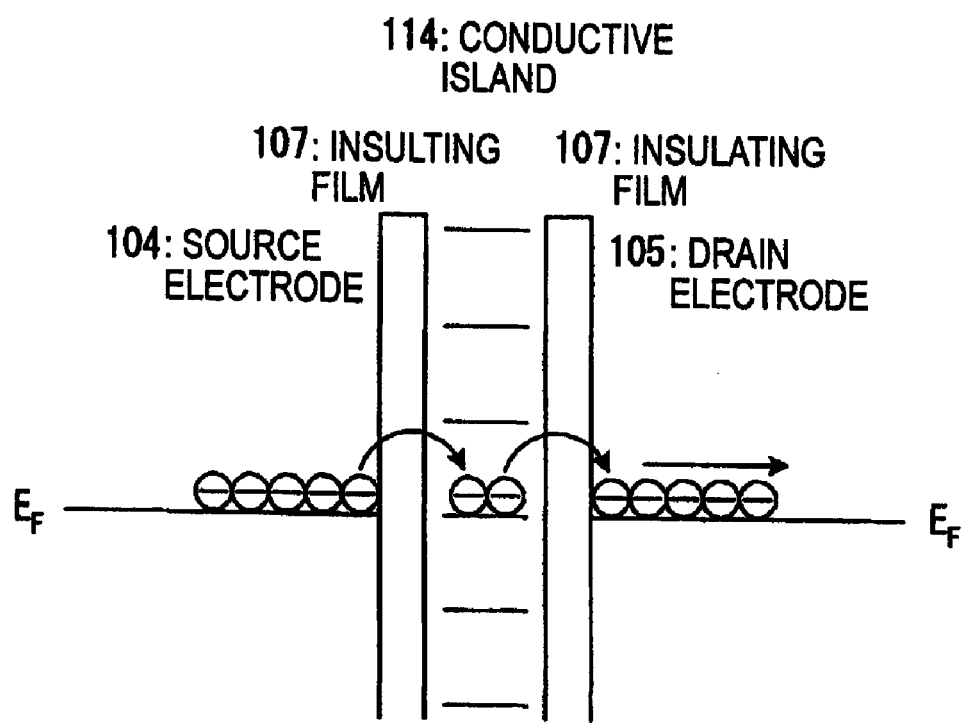
[FIG. 9] A band diagram of SET of the electromechanical filter in Embodiments 2 and 4.

The conductive island 114 is electrically separated by a gate electrostatic capacity $C_{RG}$ as a low electrostatic capacity formed between the gate electrode and the conductive island 114 via a gap, and high-resistance tunnel junctions formed between the source electrode 104 and the drain electrode 105 via the insulating film 107. A current flowing between the source electrode 104 and the drain electrode 105 can be controlled by the charge excited in the conductive island 114 in unit of a charge e of a single electron. A band diagram of the SET is shown in FIG. 9. The SET is a high-sensitivity electrometer.

The vibration of the microvibrator 101 is sensed by the sensing electrode 103 that is connected to the microvibrator 101 by the capacitive coupling, and excites an amount of change of charge $\Delta Q$ in the conductive island 114 of the SET. An amount of change of the charge $\Delta Q$ is infinitesimal. When the charge whose amount is countably small is excited in contrast to the charge e of a single electron in the conductive island 114 of the SET, an electron state of the conductive island 114 is changed. Thus, in the quantized and discrete electron band structure of the conductive island 114, the electron is blocked or not blocked by the conduction band. This phenomenon is dominated by the Pauli exclusion principle. This principle dictates that only two electrons can occupy the same energy level as the Fermi particle. In the SET, the signal is output to the drain electrode 105 by the source-drain voltage $V_{SD}$ applied between the source electrode 104 and the drain electrode 105. In this case, the source-drain current flowing between the source electrode 104 and the drain electrode 105 is changed depending upon a change of the electron state of the conductive island 114 of the SET caused by the vibration of the microvibrator 101. A switching of this signal is generated at the frequency at which an amount of change in the charge $\Delta Q$ sensed by the sensing electrode 103 connected to the conductive island 114 is changed, and the frequency is equal to the self-resonance frequency of the microvibrator 101. In other words, only when the signal of the self-resonance frequency of the microvibrator 101 is input from the signal input port IN, the signal of the same frequency is output to the signal output port OUT.

Like Embodiment 1, the electromechanical filter 300 in Embodiment 2 of the present invention can get the signal filtering characteristic shown in FIG. 4(a), and possess the band-pass filter characteristic having a center frequency fc.

In this manner, according to the electromechanical filter 300, only the signal of the predetermined frequency can be selected and output. Also, in the method of injecting the charge into the conductive island of the SET in the present invention, the voltage VP that needs a high voltage in the conventional electromechanical filter can be lowered because the SET can be controlled by a small amount of charge. Also, the noise figure NF can be lowered because of a reduction of VP.

Figure 8:
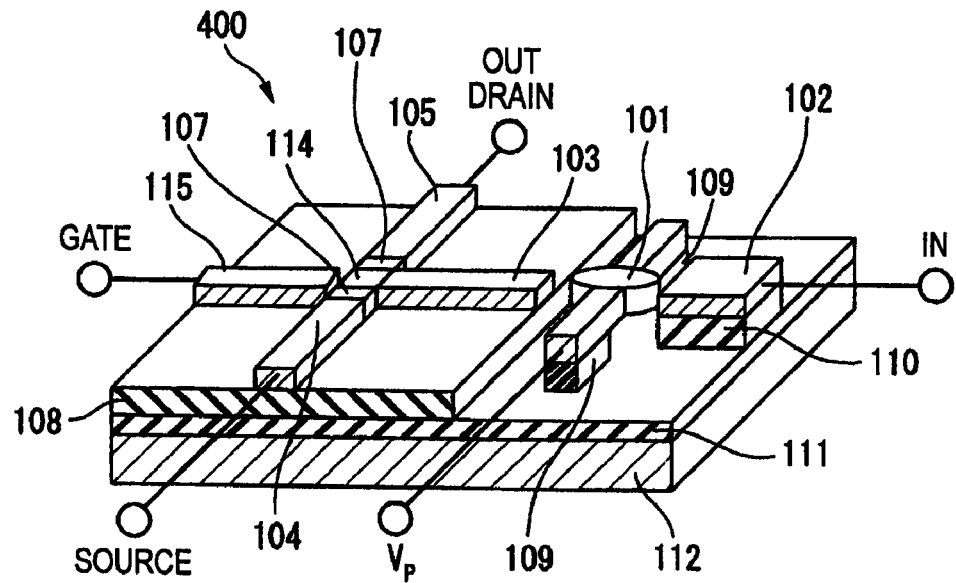
[FIG. 8] A view showing an electromechanical filter in a variation of Embodiment 2 of the present invention, wherein (a) is a perspective view showing a configuration of this electromechanical filter, and (b) is a circuit diagram showing the configuration of this electromechanical filter.
Figure 8:
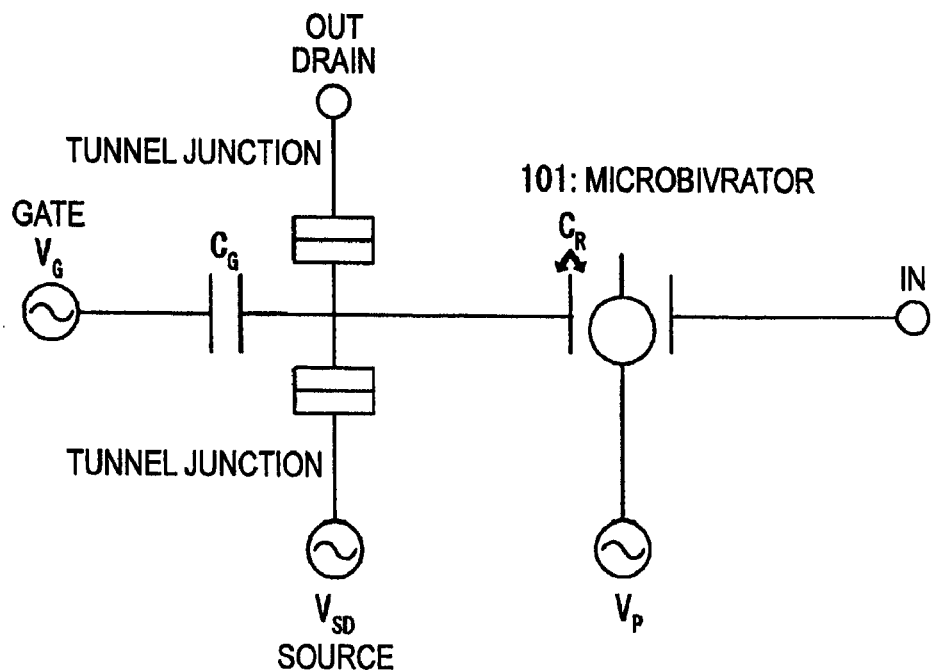

Also, in Embodiment 2 of the present invention, as shown in FIGS. 2(a) and (b) of the variation of Embodiment 1, the microvibrator 101 can be formed by the circular disk, like a variation shown in FIGS. 8(a) and (b).

FIG. 8(a) is a perspective view showing a variation of the electromechanical filter in FIG. 1. The inboard beam is used as the microvibrator 101 in the electromechanical filter 300, while the circular disk is used in an electromechanical filter 400 shown in FIG. 8(a). FIG. 8(b) is a circuit diagram showing the variation of the electromechanical filter in FIG. 1. The signal filtering can be performed by the similar configuration to the electromechanical filter 100.

In the electromechanical filter 400 in FIG. 8(a), the same names and the same symbols are affixed to the portions similar to those in the electromechanical filter 100 shown in FIG. 7(a), and their explanation will be omitted herein.

In this manner, the cantilever, the square plate, or the like can be used as the microvibrator 101 in addition to the above.

As shown in FIG. 4(b), the electromechanical filter in Embodiment 2 of present invention can be formed to have the band-stop filtering characteristic having the center frequency fc shown in FIG. 4(a).

Also, the power amplifier for amplifying a power of the output signal, or the like may be provided on the signal output port OUT side. Also, the voltage VP applied to the microvibrator 101 can be adjusted to get the maximum signal amplification factor.

Also, the signal passing band can be controlled by coupling mechanically plural pieces of microvibrators.

Also, the multi-stage filter configuration in which the electromechanical filters of the present invention are connected in parallel or in series can be constructed configuration Also, a gate voltage VG can be adjusted to get the maximum signal amplification factor.

Also, when the SET is constructed to use the low frequency of 1 kHz or less, for example, such SET can be used as a mixer. In this case, the voltage of a local oscillator is input from the gate electrode 115 at a frequency fLO that is offset from the frequency (the self-resonance frequency of the microvibrator 101) of the sensed signal by an intermediate frequency $f_{IF}$ of 1 kHz or less, and a signal of the intermediate frequency $f_{IF}=|f_{LO}-f|$ is output from the drain electrode 105 to the signal output port OUT. When the vibration of the microvibrator 101 is sensed in this manner, a circuit for restoring the output signal while upconverting the frequency from $f_{IF}$ to f is needed on the signal output port side. Also, it is desirable that the source-drain voltage $V_{SD}$ should be adjusted to optimize the mixed signal.

Embodiment 3

Next, Embodiment 3 of the present invention will be explained hereunder.

Figure 10:
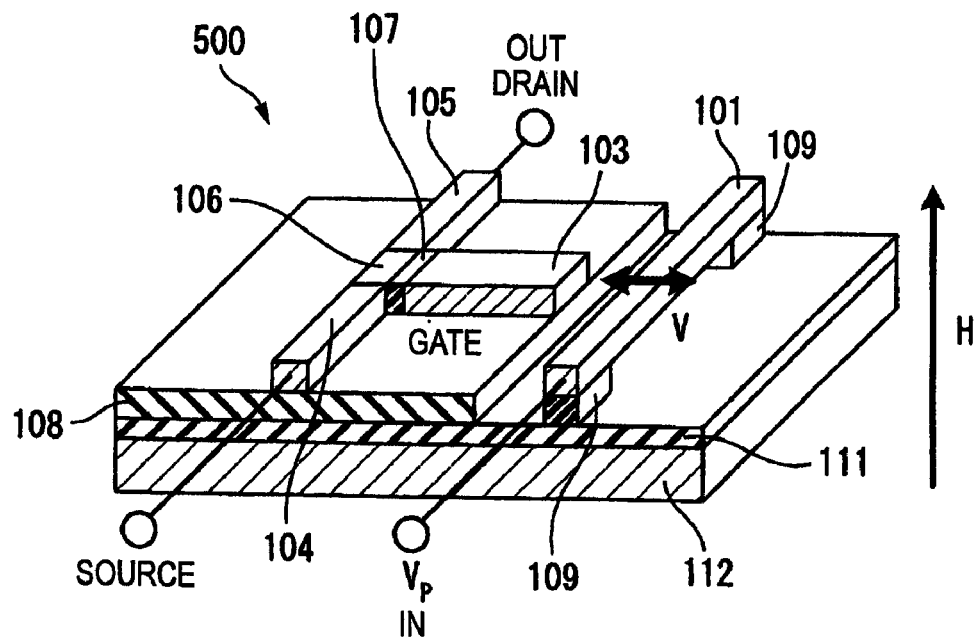
[FIG. 10] A view showing an electromechanical filter in Embodiment 3 of the present invention, wherein (a) is a perspective view showing a configuration of this electromechanical filter, and (b) is a circuit diagram showing the configuration of this electromechanical filter.
Figure 10:
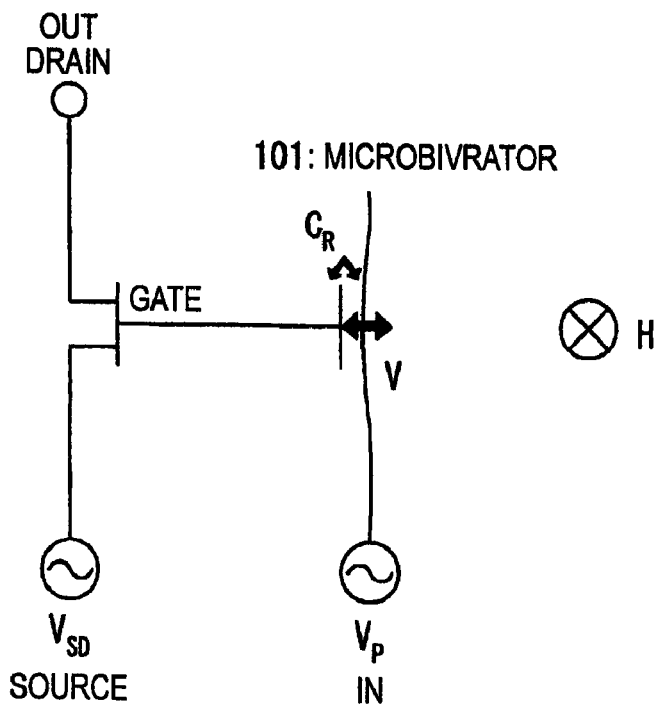

In Embodiment 1, the signal input port IN is constructed by the driving electrode 102. In contrast, in the present embodiment, the input port IN is connected directly to the microvibrator and then the microvibrator is excited by a Lorentz force instead of the electrostatic force. FIG. 10(a) is a perspective view showing a configuration of an electromechanical filter in Embodiment 3 of the present invention.

In the electromechanical filters 100, 200 in Embodiment 1, the microvibrator 101 is excited by the electrostatic force. In contrast, in an electromechanical filter 500 shown in FIG. 10(a), the exciting method is different and the microvibrator 101 is excited by the Lorentz force. Remaining portions are formed similarly to those in Embodiment 1.

Next, a method of exciting the microvibrator in the electromechanical filter 500 will be explained hereunder.

An external magnetic field H is applied to the microvibrator 101 such that the Lorentz force is applied to the microvibrator 101 in the direction along which the vibration is generated. The vibration direction of the microvibrator 101 is indicated by V, but a vector direction of the external magnetic field H is perpendicular to the substrate in this case. When the high-frequency signal is input from the signal input port IN and this high-frequency signal causes an alternating current to flow through the microvibrator 101, the Lorentz force is applied to the microvibrator 101 by the alternating current and the external magnetic field H. The direction of the Lorentz force is switched alternately based on the direction of the alternating current, but the frequency corresponds to the frequency of the high-frequency signal. In this fashion, the Lorentz force is applied to the microvibrator 101 by the high-frequency signal, and thus the microvibrator 101 is excited.

Next, the method of sensing the vibration of the microvibrator and the signal filtering mechanism in the electromechanical filter 500 will be explained hereunder.

FIG. 10(b) is a circuit diagram showing the configuration of the electromechanical filter in Embodiment 3 of the present invention. The signal being input from the signal input port IN propagates to the microvibrator 101, and then excites this microvibrator 101 at the frequency of the high-frequency signal. The microvibrator 101 is excited at a large amplitude only when the signal having the self-resonance frequency of the microvibrator 101 is input, and a distance between the microvibrator 101 and the sensing electrode 103 is changed and thus a change of an electrostatic capacity $C_R$ is caused. Subsequent explanations are similar to those in Embodiment 1.

Embodiment 4

Figure 11:
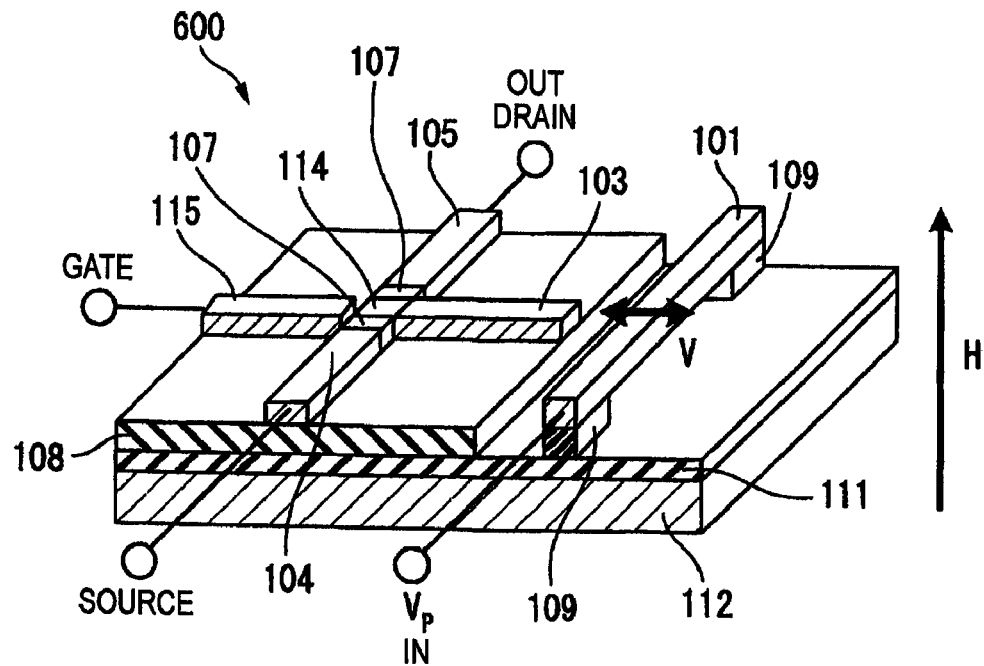
[FIG. 11] A view showing an electromechanical filter in Embodiment 4 of the present invention, wherein (a) is a perspective view showing a configuration of this electromechanical filter, and (b) is a circuit diagram showing the configuration of this electromechanical filter.
Figure 11:
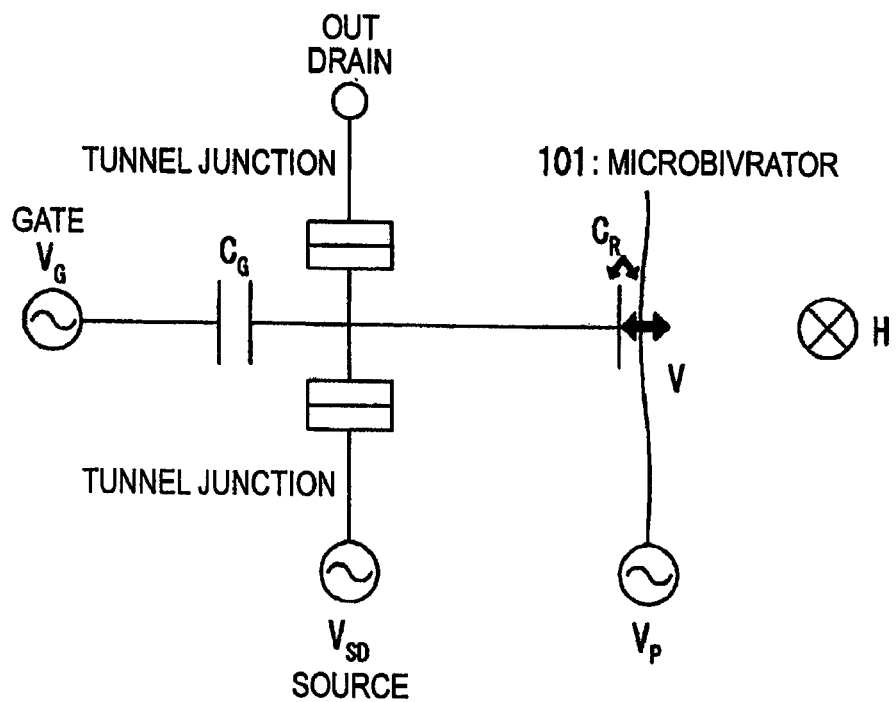

FIG. 11(a) is a perspective view showing a configuration of an electromechanical filter in Embodiment 4 of the present invention.

In Embodiment 2, the signal input port IN is constructed by the driving electrode 102. In the present embodiment, the input port IN is connected directly to the microvibrator, and the microvibrator is excited by the Lorentz force instead of the electrostatic force. The remaining configuration is formed similarly to that of Embodiment 2.

More particularly, in an electromechanical filter 600 shown in FIG. 11(a), the microvibrator 101 put between the posts 109 is provided on the substrate 112 on the surface of which the insulating layer 111 is formed. The signal input port IN for inputting the signal is connected to the microvibrator 101. A potential of the microvibrator 101 is controlled by the voltage VP applied to the microvibrator 101.

The sensing electrode 103 is provided in the vicinity of the movable electrode 101. The sensing electrode 103 is connected to the conductive island 114 of the SET (Single Electron Transistor) that consists of the source electrode 104, the drain electrode 105, the insulating film 107, the conductive island 114, and the gate electrode 115, which being provided on the insulating film 108. The signal output port OUT for outputting the signal to the outside is connected to the drain electrode 105.

FIG. 11(b) is a circuit diagram showing the configuration of the electromechanical filter in Embodiment 4 of the present invention. Since the signal input portion is similar to that in Embodiment 3 and the configuration of the sensing portion is similar to that in Embodiment 2, their explanations will be omitted herein.

Embodiment 5

Figure 12:
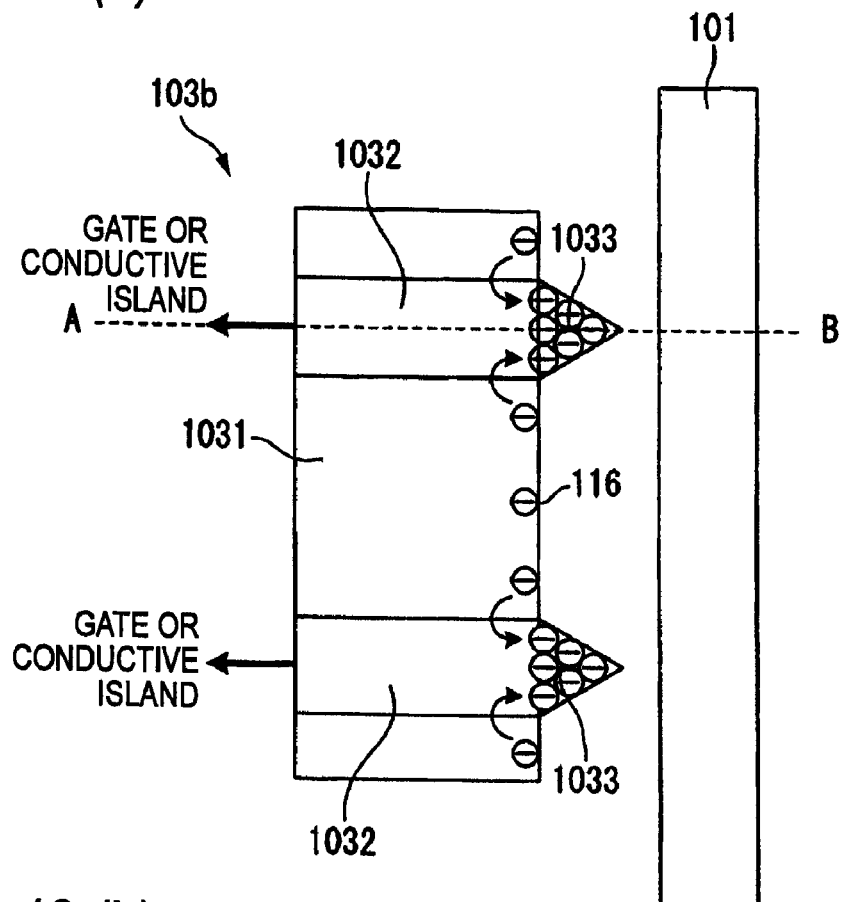
[FIG. 12] A view showing a configuration of a sensing electrode of an electromechanical filter in Embodiment 5 of the present invention, wherein (a) is a top view showing a configuration of this sensing electrode, and (b) is a sectional view showing the configuration of this sensing electrode.
Figure 12:
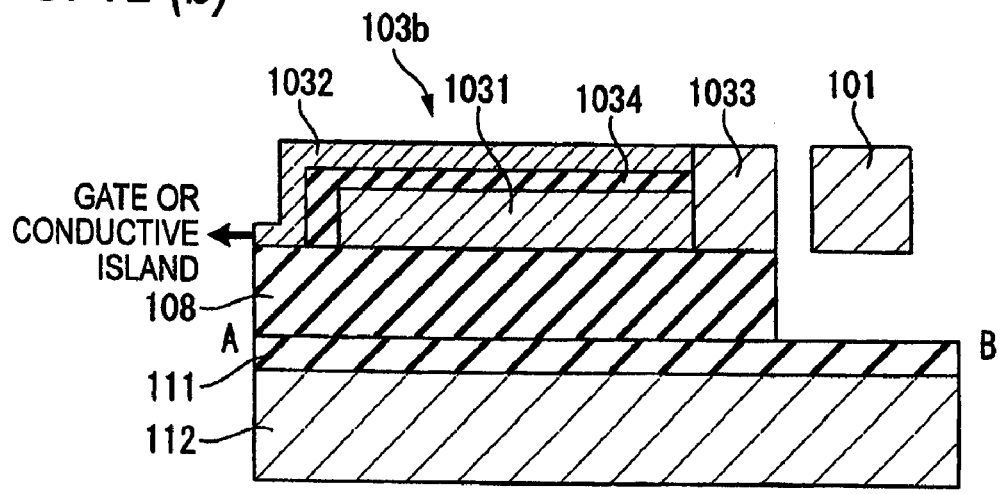

FIG. 12(a) is a top view showing a configuration of a sensing electrode of an electromechanical filter in Embodiment 5 of the present invention.

A sensing electrode 103b shown in FIG. 12(a) is composed of a charge exciting electrode 1031 and a potential sensing electrode 1032. The potential sensing electrode 1032 is branched off in two portions in the middle, and is formed on the charge exciting electrode 1031 via an insulating layer 1034 and is connected to a projection structure 1033 that opposes to the microvibrator 101. The potential sensing electrode 1032 is connected to the gate of MOSFET or the conductive island 114 of the SET The charges have such a property that they come together in a minute area and have a stable state in energy. Therefore, charges 116 excited by the vibration of the microvibrator 101 on the charge exciting electrode 1031 come together in the projection structure 1033. Since an area in which the projection structure 1033 and the microvibrator 101 oppose to each other is very small, the enlarged potential can be output to the gate of MOSFET even by the same amount of charges.

Also, according to this configuration, a very small amount of charges can be supplied effectively to the conductive island 114 of the SET.

When the microvibrator 101 is a 1 GHz band vibrator having a width 120 nm, a thickness 75 nm, and a length 1 μm, a gap between the microvibrator 101 and the charge exciting electrode 1031 is 100 nm, a vibration amplitude of the microvibrator 101 in resonance is 1 Angstrom, an amount of excited charge is 10 e (e: elementary electric charge), and a width of the sensing electrode 103 opposing to the microvibrator 101 is 500 nm, the sensed potential is 0.5 V. In contrast, in the sensing electrode 103b in Embodiment 5 of the present invention, the potential can be ten times enlarged to 5 V when a width of the charge exciting electrode is set to 500 nm and a width of the potential sensing electrode is set to 50 nm.

Here, the projection structure 1033 can be provided singly or in plural, and the projection structures 1033 can be provided at a distance within which the charges 116 can come together in the projection structure 1033, i.e., at an interval of several tens nm to several hundreds nm. Since the charges have such a property that they gather together in a minute area rather than a wide area, the projection structure 1033 may be shaped to have a minute area in the peripheral area. In this case, a structure having a sharp top end portion like a triangle is preferable in collecting the charges in a minuter area.

FIG. 12(b) is a sectional view showing the configuration of the sensing electrode of the electromechanical filter in Embodiment 5 of the present invention.

The insulating layer 1034 is formed between the charge exciting electrode 1031 and the potential sensing electrode 1032 to give the electrical insulation between both electrodes. This structure can be manufactured similarly by the manufacturing method shown in Embodiment 1 and Embodiment 2, and steps of depositing and patterning the material are employed. In the formation of the projection structures 1033, the shape can be changed by varying the mask pattern while employing the same material as the potential sensing electrode 1032 and the same mask.

INDUSTRIAL APPLICABILITY

The electromechanical filter according to the present invention can sense an infinitesimal vibration of the microvibrator by using the quantum device, and is useful as the electromechanical filter that has the high-frequency signal filtering function equipped with a high-sensitivity sensing mechanism.

The invention claimed is:

1. An electromechanical filter, comprising:
   a microvibrator that is adapted to resonate with an input signal, wherein a voltage is applied across the microvibrator to control a potential of the microvibrator;
   a sensing electrode that is arranged at a predetermined interval to the microvibrator; and
   a quantum device that senses a change in an electrostatic capacity between the microvibrator and the sensing electrode to output the change as an electric signal,
   wherein the quantum device has a source and a drain; and
   wherein the sensing electrode is an electrode provided between the source and the drain of the quantum device.

2. The electromechanical filter according to claim 1, wherein the quantum device is a MOSFET; and
   wherein the sensing electrode functions as a gate electrode of the quantum device.

3. The electromechanical filter according to claim 1, wherein the quantum device is an SET; and
   wherein the sensing electrode functions as a conductive island of the quantum device.

4. The electromechanical filter according to claim 1, wherein the sensing electrode includes a charge exciting electrode formed on an insulating layer on a substrate, a projection structure formed on a face opposing to the microvibrator of the charge exciting electrode, and a potential sensing electrode formed on the charge exciting electrode via the insulating layer and connected to the projection structure.

5. The electromechanical filter according to claim 1, wherein the microvibrator is arranged in a magnetic field and is excited by a Lorentz force generated by the magnetic field; and
   wherein an input signal is input into one end of the microvibrator.

6. The electromechanical filter according to claim 1, wherein the microvibrator has a driving electrode arranged at a predetermined interval to the microvibrator; and
   wherein the microvibrator is excited by an electrostatic force generated between the microvibrator and the driving electrode.

7. The electromechanical filter according to claim 6, wherein an input signal is input into the driving electrode.

8. The electromechanical filter according to claim 1, wherein the microvibrator and the quantum device are formed on a same substrate.

9. The electromechanical filter according to claim 1, wherein the microvibrator and the sensing electrode of the quantum device are formed of a same material.

10. The electromechanical filter according to claim 1, wherein the sensing electrode of the quantum device is formed of a semiconductor material.

11. The electromechanical filter according to claim 1, further comprising a signal amplifying unit that is provided on a signal output port side.

12. An electromechanical filter, comprising:
    a microvibrator that is adapted to resonate with an input signal;
    a sensing electrode that is arranged at a predetermined interval to the microvibrator; and
    a quantum device that senses a change in an electrostatic capacity between the microvibrator and the sensing electrode to output the change as an electric signal, wherein the quantum device is a SET;
    wherein the quantum device has a source and a drain;
    wherein the sensing electrode is an electrode provided between the source and the drain of the quantum device and functions as a conductive island of the quantum device.

13. An electromechanical filter, comprising:
    a microvibrator that is adapted to resonate with an input signal;
    a sensing electrode that is arranged at a predetermined interval to the microvibrator; and
    a quantum device that senses a change in an electrostatic capacity between the microvibrator and the sensing electrode to output the change as an electric signal,
    wherein the quantum device has a source and a drain; and
    wherein the sensing electrode is an electrode provided between the source and the drain of the quantum device and includes:
        a charge exciting electrode formed on an insulating layer on a substrate,
        a projection structure formed on a face opposing to the microvibrator of the charge exciting electrode, and a potential sensing electrode formed on the charge exciting electrode via the insulating layer and connected to the projection structure.

14. An electromechanical filter, comprising:

a microvibrator that is adapted to resonate with an input signal that is input into one end of the microvibrator, wherein the microvibrator is arranged in a magnetic field and is excited by a Lorentz force generated by the magnetic field;

a sensing electrode that is arranged at a predetermined interval to the microvibrator; and a quantum device that senses a change in an electrostatic capacity between the microvibrator and the sensing electrode to output the change as an electric signal, wherein the quantum device has a source and a drain; and wherein the sensing electrode is an electrode provided between the source and the drain of the quantum device.

* * * * *